United States Patent [19]
Schierbeek et al.

[11] Patent Number: 5,255,442
[45] Date of Patent: Oct. 26, 1993

[54] VEHICLE COMPASS WITH ELECTRONIC SENSOR

[75] Inventors: Kenneth L. Schierbeek, Zeeland; Kenneth Schofield, Holland, both of Mich.

[73] Assignee: Donnelly Corporation, Holland, Mich.

[21] Appl. No.: 811,578

[22] Filed: Dec. 20, 1991

[51] Int. Cl.$^5$ ............... G01C 17/28; G01R 33/06
[52] U.S. Cl. ........................ 33/361; 33/333; 33/356; 324/252
[58] Field of Search ............ 33/361, 333, 340, 355 R, 33/356, 357; 324/252

[56] References Cited

U.S. PATENT DOCUMENTS

| | | | |
|---|---|---|---|
| 1,946,710 | 2/1934 | Pickard | 324/252 |
| 3,683,668 | 8/1972 | Baker et al. | |
| 3,942,258 | 3/1976 | Stucki et al. | 33/361 |
| 4,445,279 | 5/1984 | Tsushima et al. | 33/361 |
| 4,525,671 | 6/1985 | Sansom | 324/252 |
| 4,533,872 | 8/1985 | Boord et al. | |
| 4,546,550 | 10/1985 | Marchent et al. | 33/361 |
| 4,720,992 | 1/1988 | Hormel | |
| 4,733,179 | 3/1988 | Bauer et al. | 33/356 |
| 4,738,031 | 4/1988 | Alberter et al. | 33/361 |
| 4,751,783 | 6/1988 | Ina et al. | 33/361 |
| 4,797,841 | 1/1989 | Hatch | 33/356 |
| 4,807,462 | 2/1989 | Al-Attar | |
| 4,862,594 | 9/1989 | Schierbeek et al. | 33/356 |
| 4,866,627 | 9/1989 | Suyama | 33/356 |
| 4,953,305 | 9/1990 | Van Lente et al. | 33/361 |
| 4,989,333 | 2/1991 | Helldörfer et al. | 33/361 |
| 5,090,231 | 2/1992 | Gallagher | 33/361 |
| 5,095,631 | 3/1992 | Gavril et al. | 33/361 |
| 5,105,548 | 4/1992 | Fowler | 33/356 |

FOREIGN PATENT DOCUMENTS 8707218 3/1987 United Kingdom.

Primary Examiner—William A. Cuchlinski, Jr.
Assistant Examiner—C. W. Fulton
Attorney, Agent, or Firm—Reising, Ethington, Barnard, Perry & Milton

[57] ABSTRACT

An electronic compass is described for use in vehicles. The compass employs a magnetoresistive sensor for sensing the earth magnetic field and the sensor is operated in alternate set/reset bias modes. The compass is provided with deviation compensation by a closed loop system including measurement of the sensor output signals and an offset current strap for nullifying the vehicle deviation field.

25 Claims, 9 Drawing Sheets

VEHICLE COMPASS WITH ELECTRONIC SENSOR

FIELD OF THE INVENTION

This invention relates to magnetic compasses for vehicles. More particularly, it relates to compasses of the type which utilize an electronic magnetic field sensor.

BACKGROUND OF THE INVENTION

Magnetic compasses are commonly used in vehicles, including land vehicles, boats and aircraft, as an aid in direction finding and navigation. There is an increasing demand for magnetic compasses especially for use in passenger cars. In this field of use, there is an increasing requirement for a compass of low cost which exhibits a relatively high degree of accuracy with great reliability and which is of small size and weight.

Magnetic compasses for vehicles may be classified according to the type of the magnetic field sensor. One type is a magnetic rotor sensor which utilizes a magnetized element rotatably mounted to align itself with the ambient magnetic field. Examples of this type of vehicle compass are disclosed in Schierbeek et al U.S. Pat. No. 4,862,594 granted Sep. 5, 1989 and in co-pending application Ser. No. 07/597,854 filed Oct. 15, 1990 by Schierbeek et al, now U.S. Pat. No. 5,131,154, granted Jul. 21, 1992. Said patents are assigned to the same assignee as this application.

Another type is a flux gate sensor which utilizes a saturable magnetic core with excitation and sense windings for sensing the direction and field strength of an ambient magnetic field. Examples of vehicle compasses with flux gate sensors are represented by Baker et al U.S. Pat. No. 3,683,668 granted Aug. 15, 1972; Bower et al U.S. Pat. No. 4,733,179 granted Mar. 22, 1988; Hormel U.S. Pat. No. 4,720,992 granted Jan. 26, 1988; and Van Lente et al U.S. Pat. No. 4,953,305 granted Sep. 4, 1990.

There is a need, especially in vehicle compasses for passenger cars, for an improved magnetic field sensor to achieve the goals of accuracy, reliability, small size and weight and low cost. However, one of the problems in meeting these goals is that of providing deviation compensation for the compass, which is required to provide a high degree of accuracy, without a large cost penalty. It is known that a magnetic compass installed in a vehicle must be calibrated in the vehicle to account for the disturbing effect of the vehicle magnetic field. It is known that vehicles produce a magnetic field due to the presence of ferromagnetic materials, electric current carrying wires and the like and this magnetic field interferes with the earth field at locations within and adjacent the body of the vehicle. The magnetic field sensor of a compass responds to the localized magnetic field in which it is immersed for the purpose of direction finding with reference to the earth magnetic field. The magnetic field vector produced by the vehicle, herein referred to as the deviating magnetic field vector, combines with the earth magnetic field vector to produce a resultant or external magnetic field vector which, without calibration or compensation is unsuitable for reliable and accurate direction finding. Fully automatic deviation compensation is needed to meet present-day demands for passenger cars.

It is known to provide deviation compensation in a magnetic compass with a rotor type sensor by use of a pair of compensation coils which are energized with current to generate a magnetic field which is equal and opposite to the deviating magnetic field. This method of deviation compensation requires the vehicle to be oriented in certain cardinal directions relative to magnetic north and adjustments of coil current must be made. This adjustment may be carried out by the vehicle driver or it may be automated in a computer controlled compass. It results in inaccuracy unless the vehicle heading is accurately aligned relative to magnetic north. Deviation compensation of this type is disclosed in the above cited Schierbeek U.S. Pat. No. 4,862,594.

Another method of deviation compensation for vehicle compasses is referred to as the one hundred eighty degree compensation method. In this, the resultant magnetic field is measured with the vehicle in any selected orientation relative to the magnetic north and then the resultant field is measured with the vehicle in an orientation displaced one hundred eighty degrees from the first orientation. Using the measured values of the magnitude and directions of the resultant fields, the deviating field is calculated for both magnitude and direction. The calculated value is stored and subtracted from the magnetic field measurements subsequently taken by the compass in use for direction finding to thereby compensate it for deviation. The use of this method for a flux gate compass is disclosed in the above cited Bower, U.S. Pat. No. 4,733,179, the Hormel, U.S. Pat. No. 4,720,992 and the Baker et al, U.S. Pat. No. 3,683,668.

Fully automatic deviation compensation systems for vehicle compasses have been proposed wherein no manual intervention is required. In the Tsushimo, U.S. Pat. No. 4,445,279, granted May 1, 1984 an automatic system is disclosed using a flux gate sensor. An A-to-D converter and microprocessor are used to calculate an offset correction to compensate for the deviating field of the vehicle after driving the car in a full circle. A fully automatic compensation system is described in the Al-Attar, U.S. Pat. No. 4,807,462 granted Feb. 28, 1989. In the system of this patent, a flux gate sensor measures three headings with the car moving, and using the headings, the coordinates are derived for the center of the earth field circle and the directional offset values are computed by using the coordinates. Another fully automatic deviation compensation system is described in the Van Lente, U.S. Pat. No. 4,953,305 cited above. In this system, a flux gate sensor is used and the maximum and minimum signal values are recorded while the vehicle is driven through a closed loop. Then, the value of the deviating vehicle field is calculated from the recorded values. The compensating current is applied to the respective X and Y axis sense coils of the flux gate sensor to nullify the deviating field.

In the prior art, it is proposed to use magnetoresistive sensors in magnetic compasses. Such a compass is shown in the Picard U.S. Pat. No. 1,946,170 granted Feb. 13, 1934 wherein the magnetoresistive elements are connected in a bridge circuit. A compass using thin film magnetoresistive sensors is described in the Stucki et al U.S. Pat. No. 3,942,258 granted Mar. 9, 1976. In this system three magnetoresistive sensors are disposed in orthogonal relationship to develop a signal corresponding to the angular relationship between the compass platform and the magnetic north. The sensors are provided with a pumping coil and an output coil wound around the film at ninety degrees to each other. The pumping coil applies an alternating bias magnetic field to the magnetoresistive film. The Sansom U.S. Pat. No. 4,525,671 granted Jun. 25, 1985 describes a magnetoresistive sensor with a single magnetoresistive element capable of sensing two components of a magnetic field. A current strap extends parallel to the magnetoresistive element and other current strap extends at right angles to the magnetoresistive element. One of the current straps carries current in alternate directions during a periodic cycle while the other strap carries current in a single direction. Another magnetic compass comprising a magnetoresistive thin film is disclosed in UK patent application No. 8707218 published Sep. 28, 1988. Two pairs of magnetoresistive thin films are arranged at right angles to each other. Means are provided to produce a biasing magnetic field and to measure a change in electric resistivity of the magnetoresistive material. The Boord et al U.S. Pat. No. 4,533,872 granted Aug. 6, 1985 describes a magnetoresistive thin film sensor of particular configuration for use as an electronic sensor in a compass.

As indicated above, the prior art is replete with vehicle compass technology in great detail. While the use of magnetoresistive sensors for compasses is suggested in the prior art, practical application requires an acceptable technique for fully automatic deviation compensation in a vehicle. Even though the prior art includes many different methods of deviation compensation for vehicle compasses, the art is lacking in respect to deviation compensation for magnetoresistive sensors.

A general object of this invention is to provide an improved vehicle compass using a magnetoresistive sensor which overcomes certain disadvantages of the prior art.

SUMMARY OF THE INVENTION

In accordance with this invention, a vehicle compass is provided which provides a high degree of accuracy and reliability with small size and weight and which is of low cost. This is accomplished using a thin film magnetoresistive sensor provided with a current conductor for providing switchable magnetic bias and a current conductor for nullifying a deviating field.

Further, in accordance with this invention, an electronic compass is provided which employs a closed loop system to nullify deviating magnetic fields.

A complete understanding of this invention may be obtained from the detailed description that follows taken with the accompanying drawings.

BEST MODE FOR CARRYING OUT THE INVENTION

Figure 1:
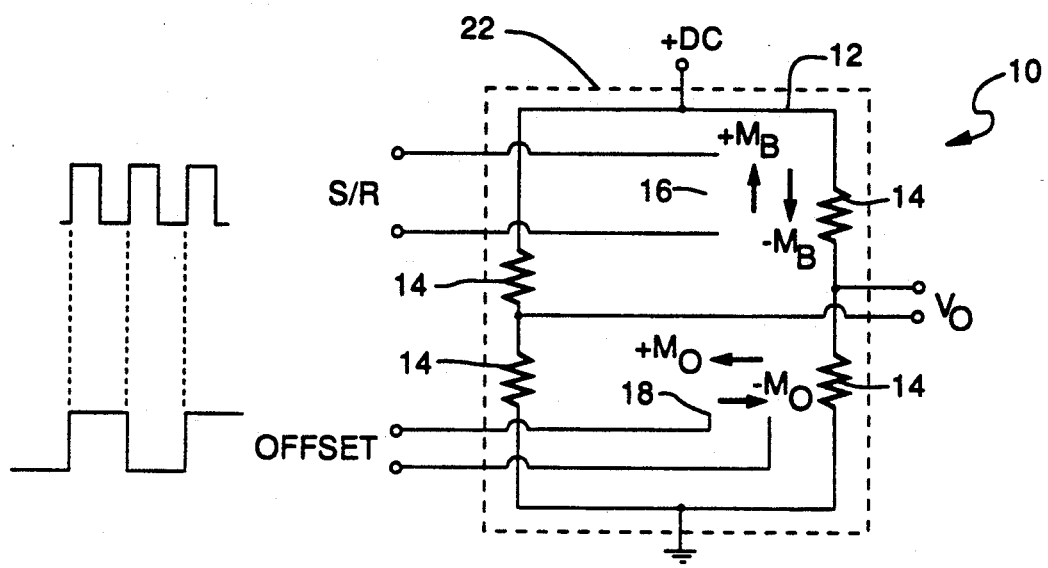
FIG. 1 depicts a single-axis magnetoresistive sensor.

Referring now to the drawings, there is shown an illustrative embodiment of the invention in a magnetic compass for vehicles which utilizes a magnetoresistive sensor. It will be appreciated as the description proceeds that the invention is useful in other applications and may be realized in different embodiments.

Before describing the compass of this invention, it will be helpful to consider the magnetoresistive sensor used in the compass. A single-axis magnetoresistive sensor is illustrated schematically in FIG. 1. The sensor 10 comprises a bridge circuit 12 including a set of four magnetoresistive elements 14 connected in the bridge circuit. The magnetoresistive elements 14 are formed of a magnetic material which exhibits the magnetoresistive effect, such as permalloy, which changes its resistivity in the presence of an external magnetic field. The bridge circuit 12 is excited with a DC voltage across the input terminals and an output signal voltage Vo is developed across the output terminals in response to an external magnetic field. The sensor 10 is provided with a bias current strap 16 which is energized by a set/reset voltage at its input terminal to produce a magnetic bias field $M_B$ which is of reversible polarity in accordance with the input voltage. Also, the sensor 10 is provided with an offset current strap 18 which is energized by a reversible polarity offset voltage applied to its input terminals. The current strap 18 produces an offset magnetic field $M_o$ which is reversible polarity in accordance with the input signal voltage. The functions of the bias current strap 16 and the offset current strap 18 will be discussed subsequently.

Preferably, the sensor 10 is fabricated on a silicon substrate on which the magnetoresistive elements 14 are deposited as a thin film. In this construction, the bias current strap 16 is formed as a current conductive layer. It overlays a soft magnetic layer which in turn overlays the elements 14. A pulse of current in one direction through the current strap 16 produces a magnetic field of sufficient strength to saturate the magnetic layer and provide a positive bias field. When the current is removed, the device remains in a biased condition under the influence of the magnetic layer. Similarly, a pulse of current in the opposite direction provides a negative bias. The offset current strap 18 is formed as a current conductive layer which overlays the magnetoresistive elements 14 and carries current in a direction perpendicular to the current carrying direction of the strap 16. The offset magnetic field $M_o$ produced by the current strap 18 is effective to oppose an external magnetic field to which the magnetoresistive elements 14 are subjected. Magnetoresistive sensors constructed by the deposition of a thin film ferromagnetic material on a silicon substrate are well-known in the art, as indicated by the Boord U.S. Pat. No. 4,533,872.

Figure 2:
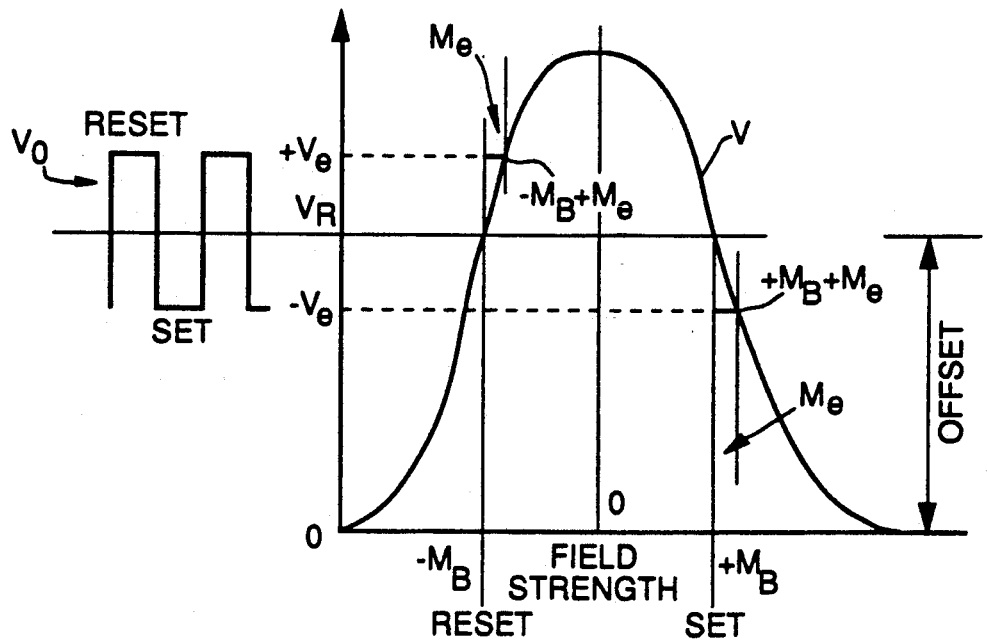
FIG. 2 is a graphical representation of the operation of a single-axis magnetoresistive sensor.

The operation of the sensor 10 will be described with reference to the graph of FIG. 2. The curve V represents the output voltage of the sensor 10 as a function of magnetic field strength in a direction perpendicular to the current flow in the magnetoresistive elements 14.

When the field strength is zero, the output voltage V has a maximum value and as the field strength is increased from zero in either direction, the output voltage decreases symmetrically. (The terms 'positive' and 'negative' and the symbols therefor are used in a relative sense to denote opposite directions or polarity of magnetization.) The voltage curve near the peak is highly non-linear and tends to become substantially linear in a mid-range of the voltage variation. In order to obtain directional information regarding an external magnetic field, a bias field having a field strength alternating between $+M_B$ and $-M_B$ is applied to the magnetoresistive elements 14. This is accomplished by the bias current strap 16 and the associated soft magnetic layer which is alternately driven into magnetic saturation by current pulses of alternate polarity through the current strap 16. When a current pulse is applied in one direction the device will operate with a positive bias, $+M_B$, which herein is called the "set mode" until the saturation of the soft iron magnetic layer is reversed. A current pulse in the opposite direction will reverse the direction of saturation and the device will operate with a negative bias, $-M_B$, herein called the "reset mode".

When the device is operated in the alternating set/reset modes and when subjected to zero field strength, the output voltage V will have a value $V_R$ in the set mode and also in the reset mode so that the output voltage remains constant at the $V_R$ level. When the sensor 10 is subjected to an external magnetic field $M_c$, the external field is combined with the bias field $M_B$. As shown in FIG. 2, if the external field is of positive polarity, i.e. $+M_c$, it will add to the bias field $+M_B$ to produce a resultant field strength $M_B+M_c$ which results in an output voltage $-V_c$. In the reset mode, the external field $+M_c$ decreases the bias field $-M_B$ to produce a net field strength of $-M_B+M_c$. This produces an output voltage in the reset mode of $+V_c$. Thus, the output voltage of the sensor 10, when subjected to an external magnetic field of $+M_c$, is an alternating square wave voltage of the same frequency as the alternating square wave voltage applied to the bias current strap 16. The output voltage varies from a positive peak value of $+V_c$ in the reset mode to a negative peak value of $-V_c$ in the set mode. As indicated in FIG. 2, the peak-to-peak value of the output voltage Vo represents the external field $M_c$. As will be discussed subsequently, the voltage $V_R$ is an offset voltage which is removed from the output voltage $V_o$ by AC coupling. It is noted further that if the output voltage $V_o$ is positive in the reset mode, the external field $M_c$ is positive and if the output voltage $V_o$ is positive in the set mode the external field is negative. It is only necessary to measure the positive portion of the output voltage $V_o$ to determine the magnitude of the external field and the direction of the external field $M_c$ will be known from its polarity and whether it is in the set or reset mode.

Figure 3:
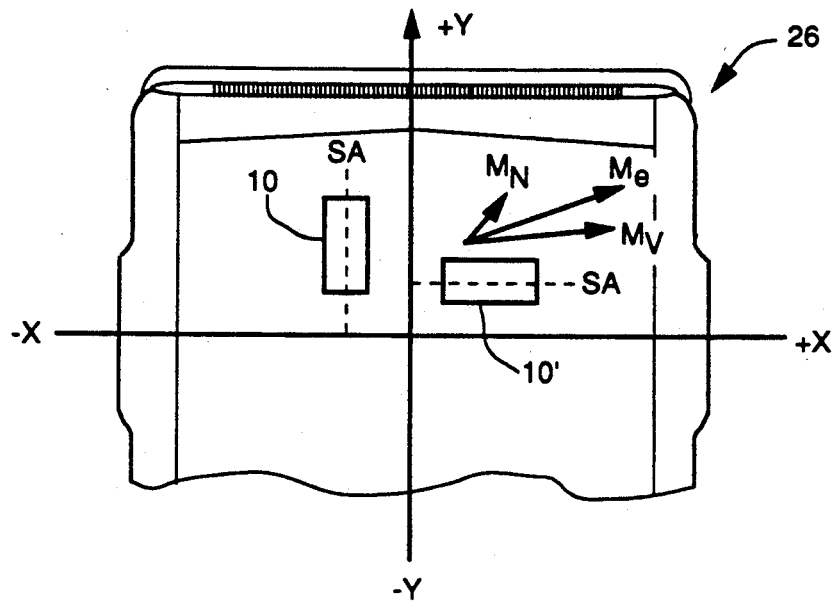
FIG. 3 is a diagram representing a typical relationship of the compass sensor and certain magnetic field vectors with the directional axis of a vehicle in which the compass of this invention is installed.

Now consider the sensor 10 installed in a vehicle 26, such as a passenger car, as depicted in FIG. 3. In order to determine the direction of the external field $M_c$, it is necessary to use two single-axis sensors 10 and 10' which are orthogonally oriented relative to each other. The sensor 10 is mounted in the vehicle with its sensitive axis SA parallel to the direction reference axis, i.e. the longitudinal axis Y—Y of the vehicle 26. The sensor 10' is of the same construction as sensor 10 and is mounted adjacent the sensor 10 with its sensitive axis extending parallel to the X—X axis of the vehicle. In such an installation, the sensors are subject to the earth magnetic field $M_N$ which is stationary with reference to the earth and it is also subjected to the vehicle magnetic field $M_v$ which is stationary with respect to the vehicle. The external field $M_c$ to which the sensor 10 is subjected is the vector sum of the earth field and the vehicle field. Accordingly, the sensor 10 responds to the Y-axis component of the vehicle field and the sensor 10' responds to the X-axis component. The vehicle field $M_v$ remains constant regardless of the direction heading of the vehicle 26. However, the external magnetic field $M_c$ includes a component due to the earth field $M_N$ and the output voltages of the sensors 10 and 10' vary with vehicle heading relative to the magnetic north direction, as will be discussed below.

Figure 4:
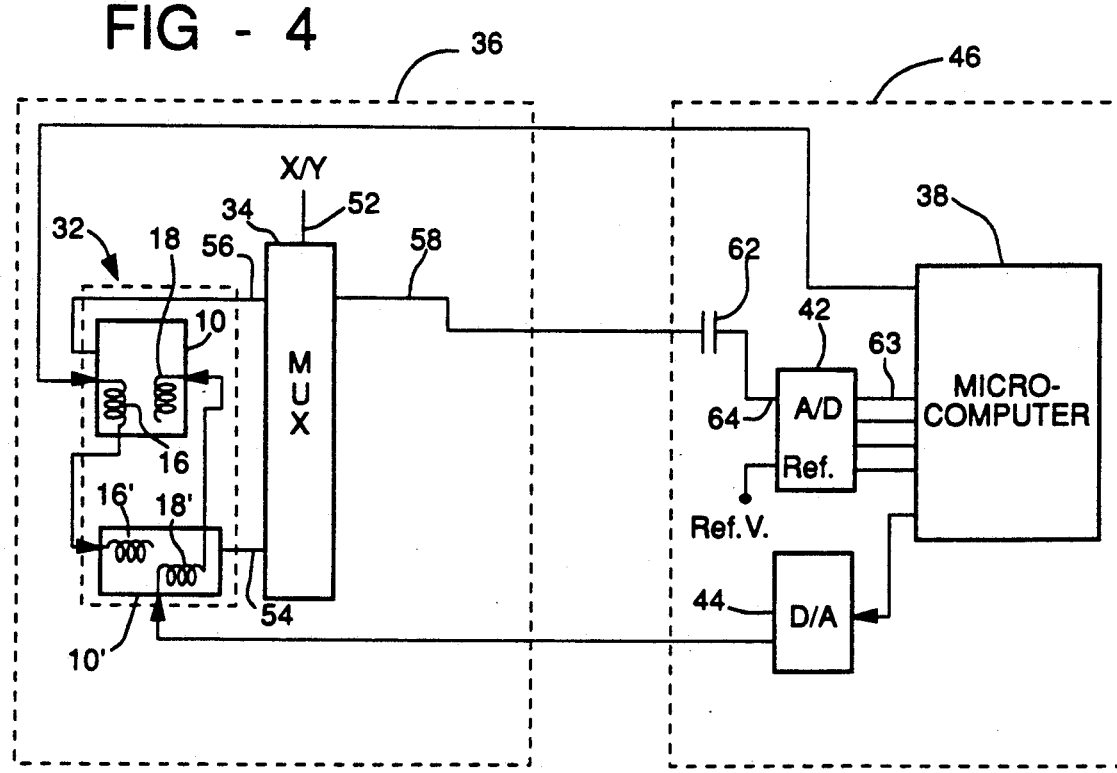
FIG. 4 is a block diagram of a compass embodying this invention.

The electronic compass of this invention is shown in block diagram in FIG. 4. In general, the compass comprises a two-axis sensor 32 and a multiplexer 34 which are mounted on a sensor circuit board 36. It also comprises a microcomputer 38, an analog-to-digital converter 42 and a digital-to-analog converter 44 which are mounted on a mother board 46. The circuits of FIG. 4 are operative to measure the X and Y-axis output signals and to process the signals to eliminate the DC voltage offset and to nullify the effect of the vehicle deviating magnetic field to obtain deviation compensation of the compass. The microcomputer 38 is operated under a control program to process the signals to achieve deviation compensation and to compute the magnetic heading of the vehicle, as will be described subsequently.

The circuit of FIG. 4 will now be described in greater detail. The two-axis sensor 32 comprises the Y-axis sensor 10 and the X-axis sensor 10' mounted with respect to each other and the vehicle 26 as described above. A multiplexer 34 has an address select input 52 for selecting X or Y-axis output signals. The output signal of the Y-axis sensor 10 is applied to an input 56 of the multiplexer and the X-axis output signal of the sensor 10' is applied to an input 54 of the multiplexer. The output signal of the multiplexer at output 58 is coupled through a capacitor 62 to the input 64 of the A/D converter 42. The capacitor 62 provides AC coupling between the multiplexer output 58 and the A/D converter input 64 to block the DC offset voltage $V_R$ discussed above with reference to FIG. 2. Thus, the amplitude of the output voltages of the sensors 10 and 10' which must be measured by the A/D converter 42 is reduced by the value of the DC offset voltage.

The output of the A/D converter 42 is applied to inputs 63 of the microcomputer 38. The microcomputer 38 processes the digital signal outputs of the A/D converter 42 in accordance with an algorithm for determining the nullifying magnetic field for the respective X-axis and Y-axis sensors 10' and 10 to offset and nullify the effect of the deviating vehicle magnetic field on the sensors. This algorithm is embodied in the program (see FIG. 7) of the microcomputer 38 which will be described subsequently.

Figure 5A:
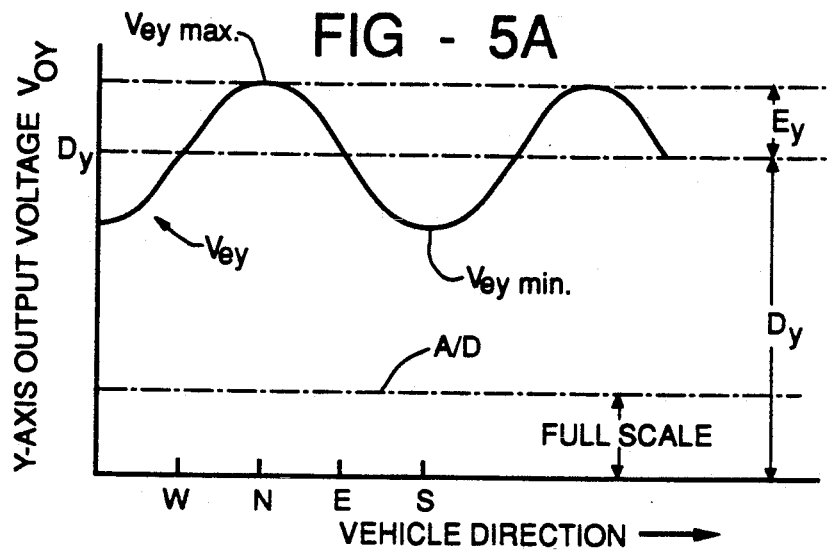
FIGS. 5A and 5B are a graphical representation of the operation of the compass of FIG. 4.

The manner in which the compass is compensated for deviation due to the vehicle magnetic field will be described, in general, with reference to FIGS. 5A and 5B. With the compass represented in FIG. 4 installed in the vehicle 26, as described With reference to FIG. 3, the output signal of the sensor 10 as it is applied through AC coupling to the input of the A/D converter 42 is represented by the waveform $V_{cy}$ in FIG. 5A. This signal $V_{cy}$ has an offset component $D_y$, prior to deviation compensation, which is of constant value and produced by the Y-axis component of the vehicle field. The Y-axis output signal $V_{cy}$ has an alternating component $E_Y$ which is produced by the earth magnetic field in accordance with the direction heading of the vehicle 26. The component $E_Y$ varies in a sinusoidal manner as shown in FIG. 5A relative to the signal level $D_y$ as the vehicle is driven through various directions relative to magnetic north. The waveform $V_{cy}$ of the Y-axis output signal may be produced over a relatively short time period or a long time period; it is depicted in FIG. 5A without regard to time. The output signal, instead, is plotted as a function of vehicle direction. When the vehicle is headed in the direction of magnetic north, the output signal $V_{cy}$ is at its maximum value $V_{cymax}$ and when it is headed in the magnetic south direction it is at a minimum value, $V_{cymin}$. When the heading is either west or east, the value of the Y-axis signal $V_{cy}$ is at the value of the deviation component $D_Y$ which is half way between the maximum and minimum values.

It is required to determine the current in the deviation offset strap 18 for nullifying the Y-axis component of the deviating magnetic field. For this purpose, the A/D converter 42 is set with a full-scale range of reading capability which is equal to or slightly greater than the maximum value of the earth field component $E_Y$ which occurs within the geographical range, such as the North American continent, in which the vehicle may be operated. This full scale range of the A/D converter 42 is represented by the signal voltage level designated A/D in FIG. 5A. The operation of the compass circuit to achieve the deviation offset current in strap 18 of the sensor 10 will be described subsequently.

Figure 5B:
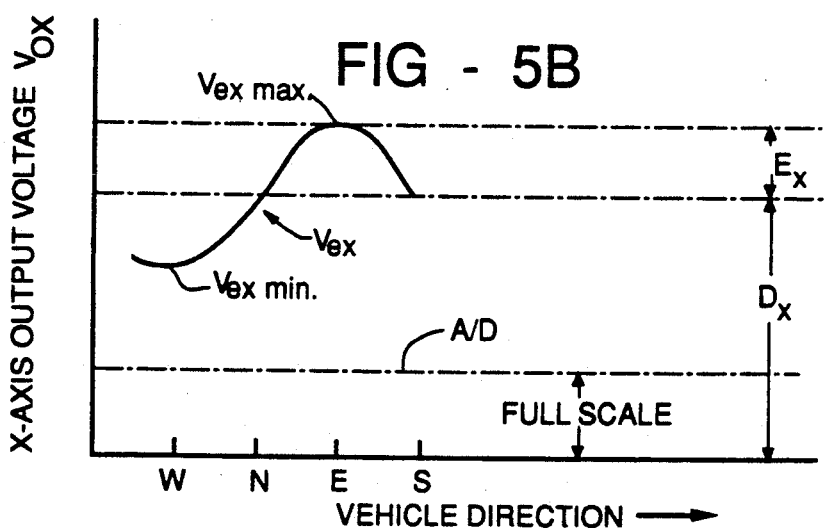

In a manner analogous to that described above for the Y-axis output signal of sensor 10, with reference FIG. 5A, the X-axis sensor 10' produces an X-axis output signal $V_{ex}$ as depicted in FIG. 5B. It is noted that this signal $V_{ex}$ has a component $D_x$ which is constant as a result of the X-axis component of the deviating vehicle field. It also has an alternating component $E_x$ due to the earth field which varies in accordance with the direction heading of the vehicle. However, the alternating component, while varying in a sinusoidal manner, is ninety degrees out-of-phase with the variable component $E_Y$ in the output signal of the Y-axis sensor 10. It is noted that the deviation component $D_x$ of the output signal $V_{ex}$ of the X-axis sensor 10' is typically different in magnitude from the deviation component $D_Y$ of the output signal $V_{cy}$ of the Y-axis sensor 10; the relative magnitudes depend upon the direction of the vehicle magnetic field vector $M_v$ and they are equal to each other only when the vector is at forty-five degrees or an odd multiple thereof relative to the longitudinal axis of the vehicle. On the other hand, the alternating component $E_x$ in the X-axis sensor output signal $V_{ex}$ has the same amplitude as the alternating component $E_Y$ the output signal $V_{EY}$ of the Y-axis sensor 10. As indicated in FIG. 5B, the full scale range of the A/D converter 42, designated by the signal level A/D, is the same for the sampling of both the Y-axis and X-axis output signals by the A/D converter 42.

The operation of the electronic compass will now be described with reference to FIGS. 4, 5A, 5B, 6 and 7. An accurate determination of the vehicle magnetic heading can be made only if the influence of the deviating magnetic field of the vehicle is nullified. When such nullification is achieved, the Y-axis and X-axis output signals correspond only to the components of the earth magnetic field and can be combined in a known functional relationship to determine the direction of the magnetic north vector. The operation of the magnetic compass for achieving nullification of the deviating magnetic field, for deviation compensation of the compass, will now be described.

Figure 6:
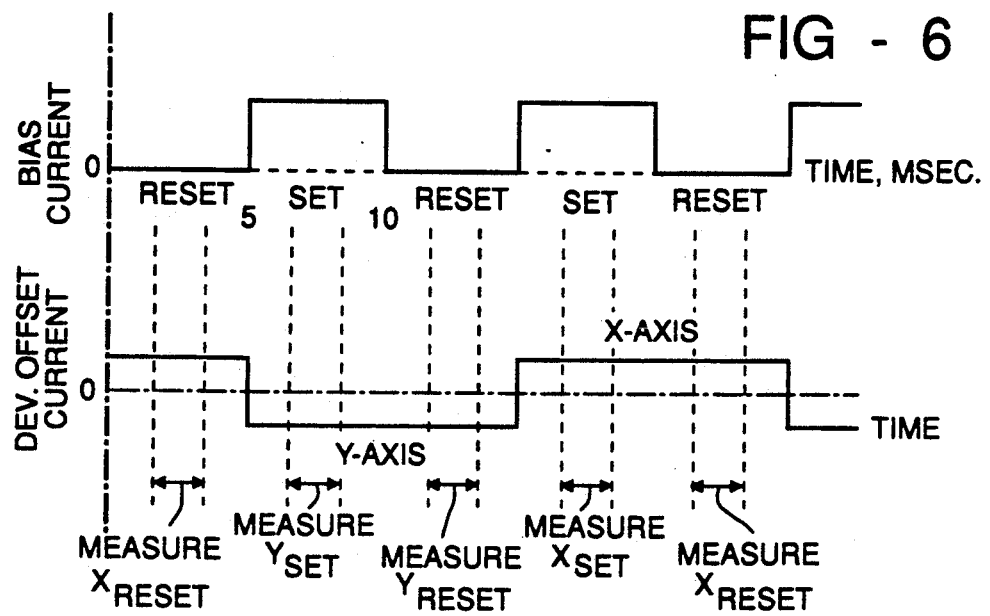
FIG. 6 is a timing diagram to aid in explanation.

A timing diagram depicting the operation for nullification of the deviating vehicle magnetic field and measurement of the earth magnetic field is shown in FIG. 6. The sensors 10 and 10' are alternately operated in the set mode and the reset mode simultaneously with each other under timing control signals from the microcomputer 38. In particular, the bias current straps 16 and 16' of sensors 10 and 10', respectively, are connected in series and are energized with the same current pulse in the reset direction for a reset period, say five milliseconds, and are energized with the same current pulse in the set direction for a set period, say five milliseconds. During the reset mode, as indicated in FIG. 6, the output signal of the X-axis sensor 10' is measured by the A/D converter 42. Initially, as indicated in FIG. 5B the amplitude of the output signal $V_{ex}$ is greater than the full scale of the A/D converter. As a result of such measurement, the microcomputer 38 produces an output signal to the D/A converter 44 which causes it to produce an increment of deviation offset current having a polarity, in the deviation offset current strap 18' of the sensor 10', such that it nullifies an increment of the X-axis component of the vehicle deviating field. Further, as shown in FIG. 6, during the set mode, the output signal of the Y-axis sensor 10 is measured by the A/D converter 42. Initially, as indicated in FIG. 5A, the value of the output signal $V_{ey}$ will be greater than the full scale of the A/D converter. As a result of this measurement, the microcomputer 38 will provide a control signal to the D/A converter 44 to produce an increment of deviation offset current in the offset current strap 18 of the Y-axis sensor 10 with a polarity such that it nullifies an increment of the Y-axis component of the vehicle deviating field. Next, as indicated in FIG. 6, the output signal of the y-axis sensor 10 is measured during the reset cycle. Following that, the output signal of the X-axis sensor 10' is measured during the set mode and then it is measured during the reset mode. For each output signal measurement which determines that the signal magnitude is greater than the full scale of the A/D converter 42, the current in the corresponding deviation offset current strap 18 or 18' is incrementally increased. This process continues until the deviation offset current in the current strap 18 of the Y-axis sensor is at a level within the full scale of the A/D converter 42 which is of such value that the Y-axis component of the vehicle deviating field is substantially nullified. The same is done with respect to the X-axis sensor. In this condition, the values of the Y-axis output signal and the X-axis output signal correspond accurately to the earth magnetic field for the particular vehicle headings during which measurements are made. The deviation compensation process is continuous during vehicle operation; the first cycle of compensation is completed when the vehicle has turned through a full circle from any arbitrary starting point. Turning of a full circle is indicated by the occurrence of the peak values $V_{eymax}$ and $V_{eymin}$ corresponding to the maximum and minimum output signals of the Y-axis sensor and the occurrence of $V_{exmax}$ and $V_{exmin}$ corresponding to the maximum and minimum values of the output signals of the X-axis sensor.

Figure 7:
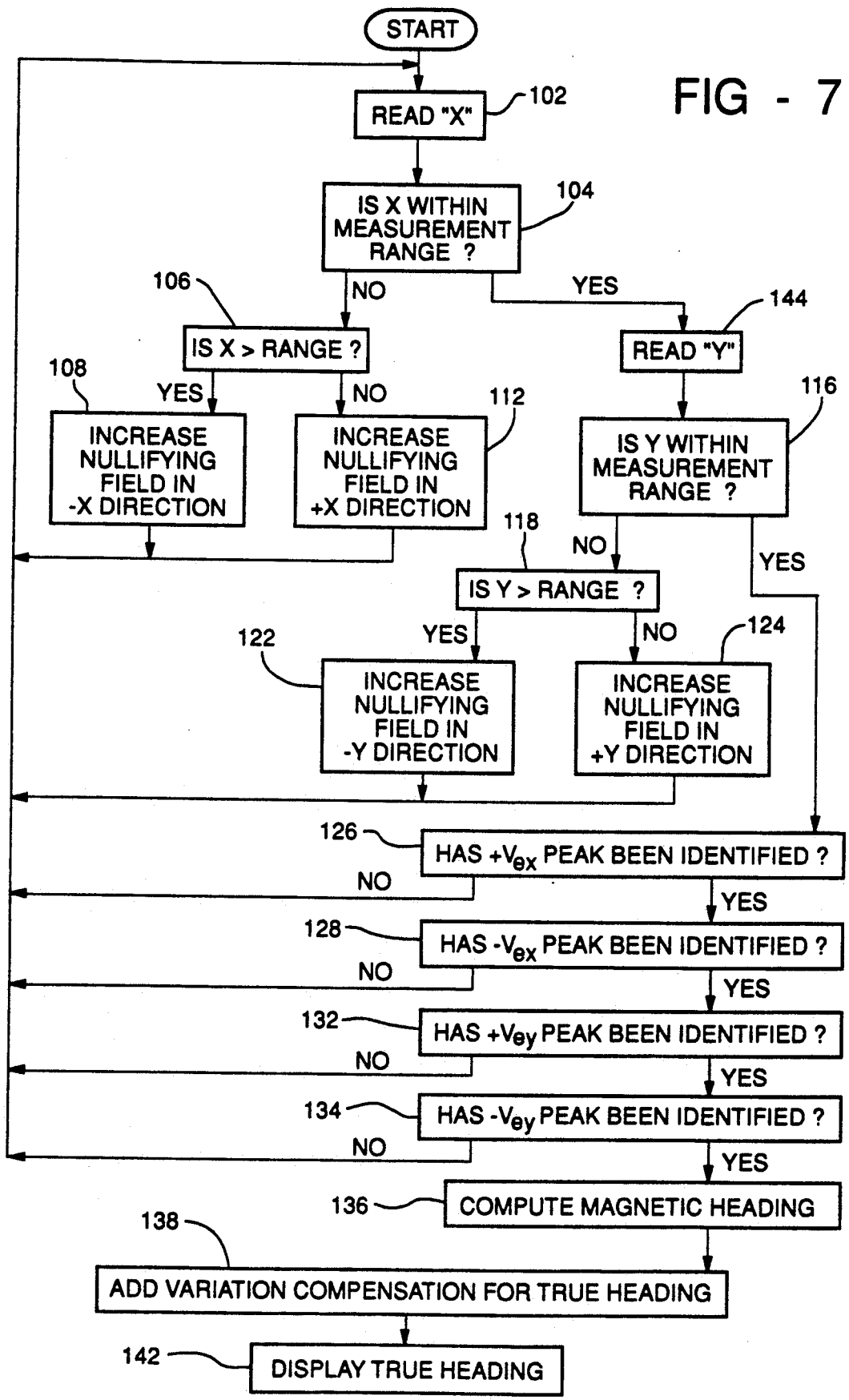
FIG. 7 is a flow chart representing the program executed by the microcomputer of the compass.

FIG. 7 is a flow chart representing the program of the microcomputer 38. At block 100, the execution of the program is started and it proceeds to block 102 which reads the output signal of the X-axis sensor 10'. In block 104 the program determines whether the value of the X-axis signal is within the full scale range of the A/D converter 42. If it is not, the program advances to block 106 which determines whether the value of X is greater than the full scale of the A/D converter 42. If it is, block 108 increases the nullifying field in the $-X$ direction and the program loops back to block 102. If block 106 determines that X is not greater than the full scale, block 112 increases the nullifying field in the $+X$ direction and the program loops back to block 102.

If at block 104 it is determined that the measured value of X-axis output signal is within the full scale range of the A/D converter 42, the program advances to block 144 which reads the measurement of the output signal of the Y-axis sensor 10. Then, block 116 determines whether the value of the Y-axis signal is within the full scale range of the A/D converter 42. If it is not, block 118 determines whether the value is greater than the full scale range. If it is, block 122 increases the nullifying field in the Y-axis sensor 10 in the $-Y$ direction. Then, the program loops back to block 102. If at block 118 it is determined that the output signal of the Y-axis sensor is not greater than the full scale range of the A/D converter, block 124 increases the nullifying field of the Y-axis sensor in the $+Y$ direction and the program loops back to block 102. This program execution is continued until at block 104 it is determined that the X-axis output signal is within the full scale range of the A/D converter 42 and further it is determined at block 116 that the output signal of the Y-axis sensor is within the full scale range. Then, the program advances to block 126 which determines whether the maximum value or positive peak of the output signal of the X-axis sensor 10' has been identified. If it has not, the program loops back to block 102. If it has, the program advances to block 128 which determines whether the minimum value or negative peak of the output signal of the X-axis sensor has been identified. If it has not, the program loops back to block 102; if it has, the program advances to block 132. Block 132 determines whether the maximum value or positive peak of the output signal of the Y-axis sensor has been identified. If it has not, the program loops back to block 102. If it has, the program advances to block 134. Block 134 determines whether the minimum value or negative peak of the output signal of the Y-axis sensor has been identified. If not, the program loops back to block 102. If it has, it is determined that the deviation compensation procedure has completed a full cycle.

In this state, the X-axis and Y-axis output signals correspond substantially to the earth magnetic field and are suitable for computing the magnetic heading of the vehicle. It will be understood that the process described is repeated continuously and adjusts the deviation compensation in accordance with changes in the vehicle magnetic field that may occur and to continually enhance the accuracy of the heading indication. When the block 134 determines that a full cycle of deviation compensation has been executed, the program advances to block 136 which computes the magnetic heading of the vehicle. Then, block 138 adds a stored value of variation compensation to obtain the true heading of the vehicle. The true heading is displayed for the information of the vehicle driver by block 142.

The circuit of the electronic compass is shown in the schematic diagrams of FIGS. 8, 9, 10A, 10B and 11.

Figure 8:
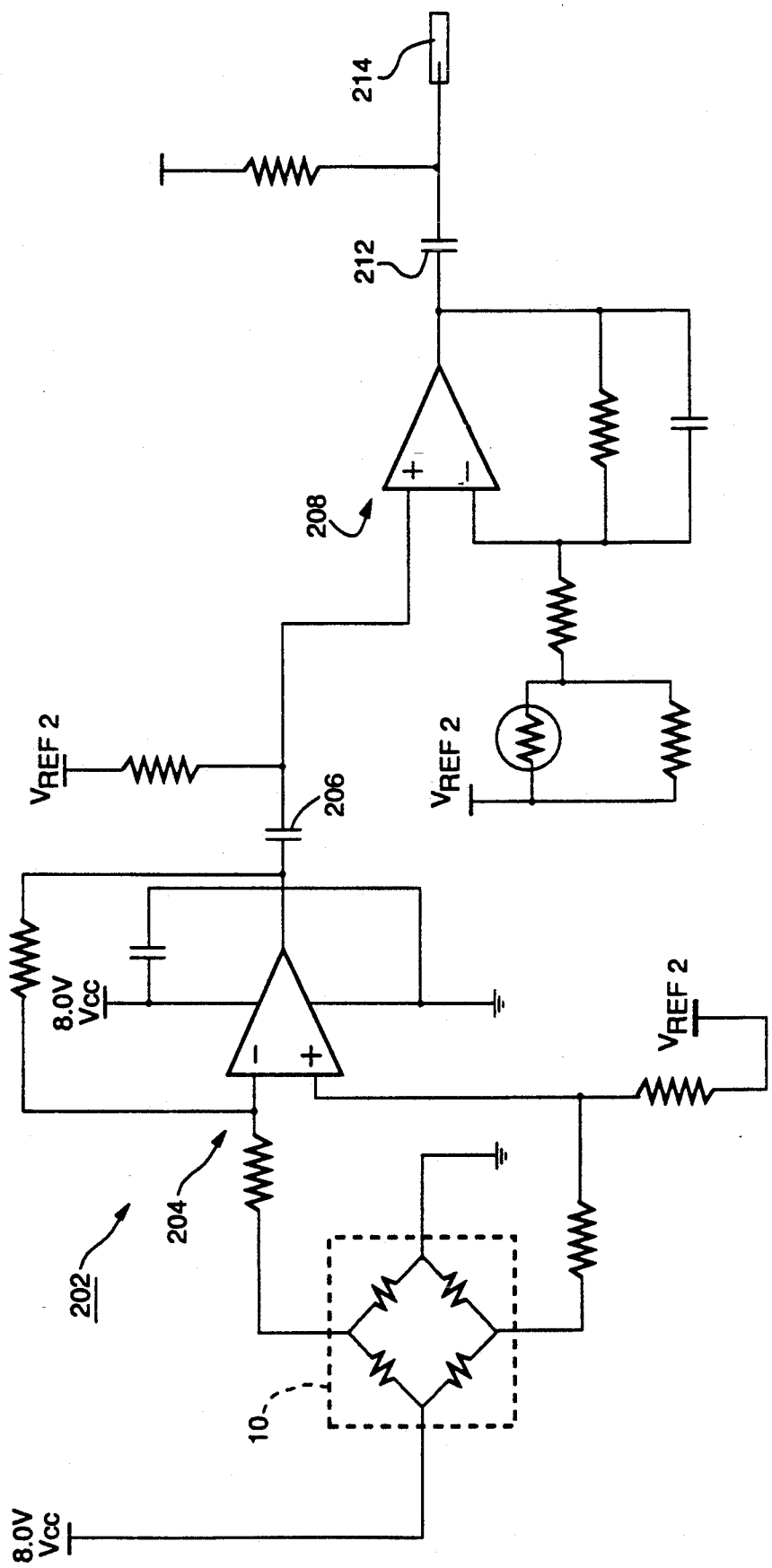
FIG. 8 is a schematic diagram of the Y-axis signal channel of the compass embodying this invention.

FIG. 8 shows the Y-axis signal channel 202 for developing the output signal $V_{ey}$ from the output sensor 10. The bridge circuit of the sensor 10 is excited with a D/C voltage $V_{cc}$. The output of the bridge circuit is supplied to the input of a first stage amplifier 204 which provides a voltage gain of about ten or twelve. The amplified output is applied through an AC coupling capacitor 206 to the input of a second stage amplifier 208 which provides a gain of about twenty. The output of the amplifier 208 is applied through an AC coupling capacitor 212 to a terminal 214 for application of the signal $V_{ey}$ to the circuit shown in FIG. 10A which will be described presently.

Figure 9:
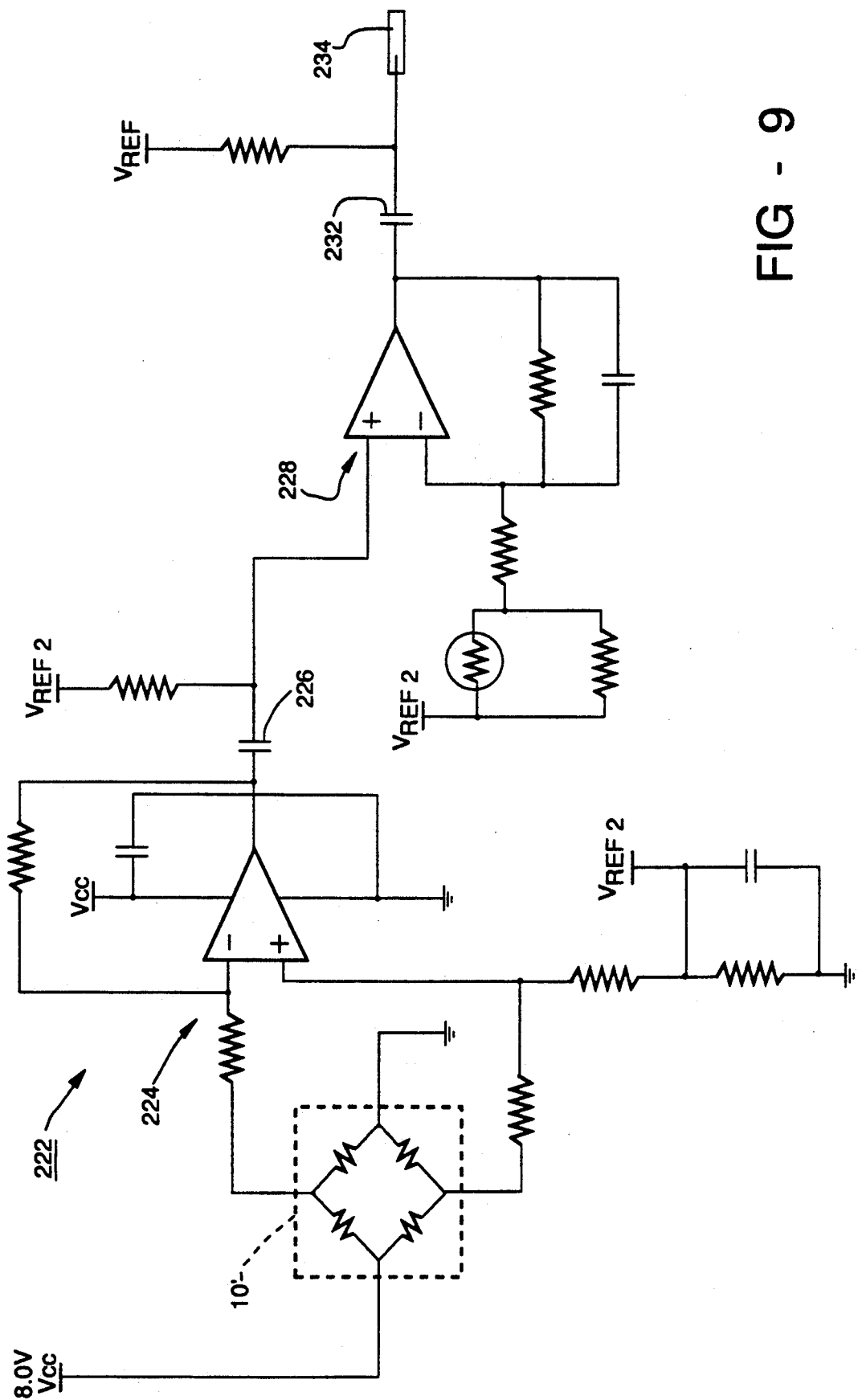
FIG. 9 is a schematic diagram of the X-axis signal channel.

The X-axis channel 222 for developing the output signal $V_{ex}$ from the output sensor 10' is shown in FIG. 9 and is similar to that of FIG. 8. The bridge circuit of the sensor 10' is excited with the DC voltage $V_{cc}$. The output of the bridge circuit is supplied to the input of a first stage amplifier 224 which provides a voltage gain of about ten or twelve. The amplified output is applied through an AC coupling capacitor 226 to the input of a second stage amplifier 228 which provides a gain of about twenty. The output of the amplifier 228 is applied through an AC coupling capacitor 232 to a terminal 234 for application of the signal $V_{ex}$ to the circuit shown in FIG. 10A which will be described presently.

Figure 10A:
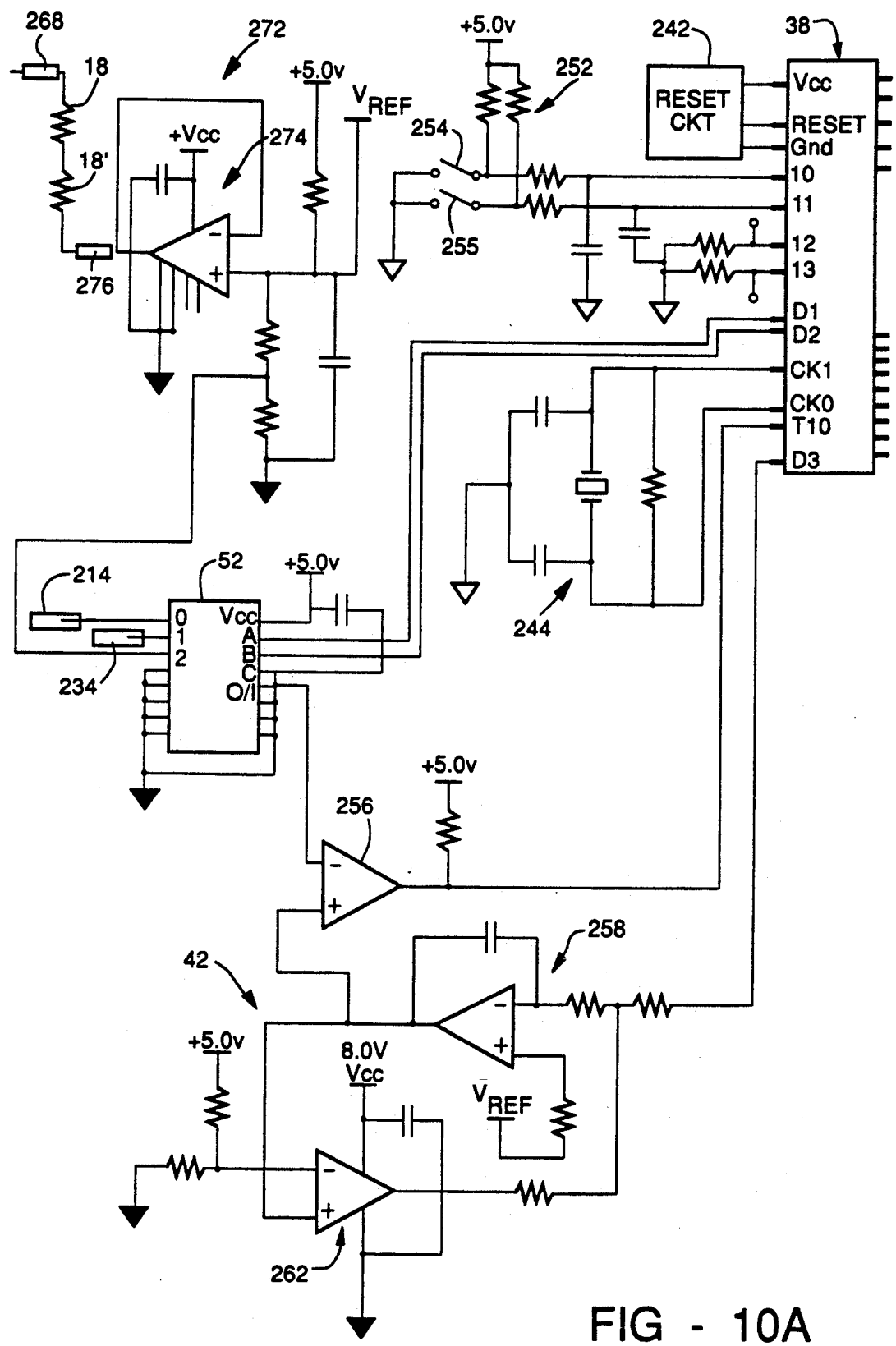
FIGS. 10A and 10B taken together form a schematic diagram of electronic circuits, including the microcomputer, which are coupled with the circuits of FIGS. 8 and 9 of the compass.
Figure 10B:
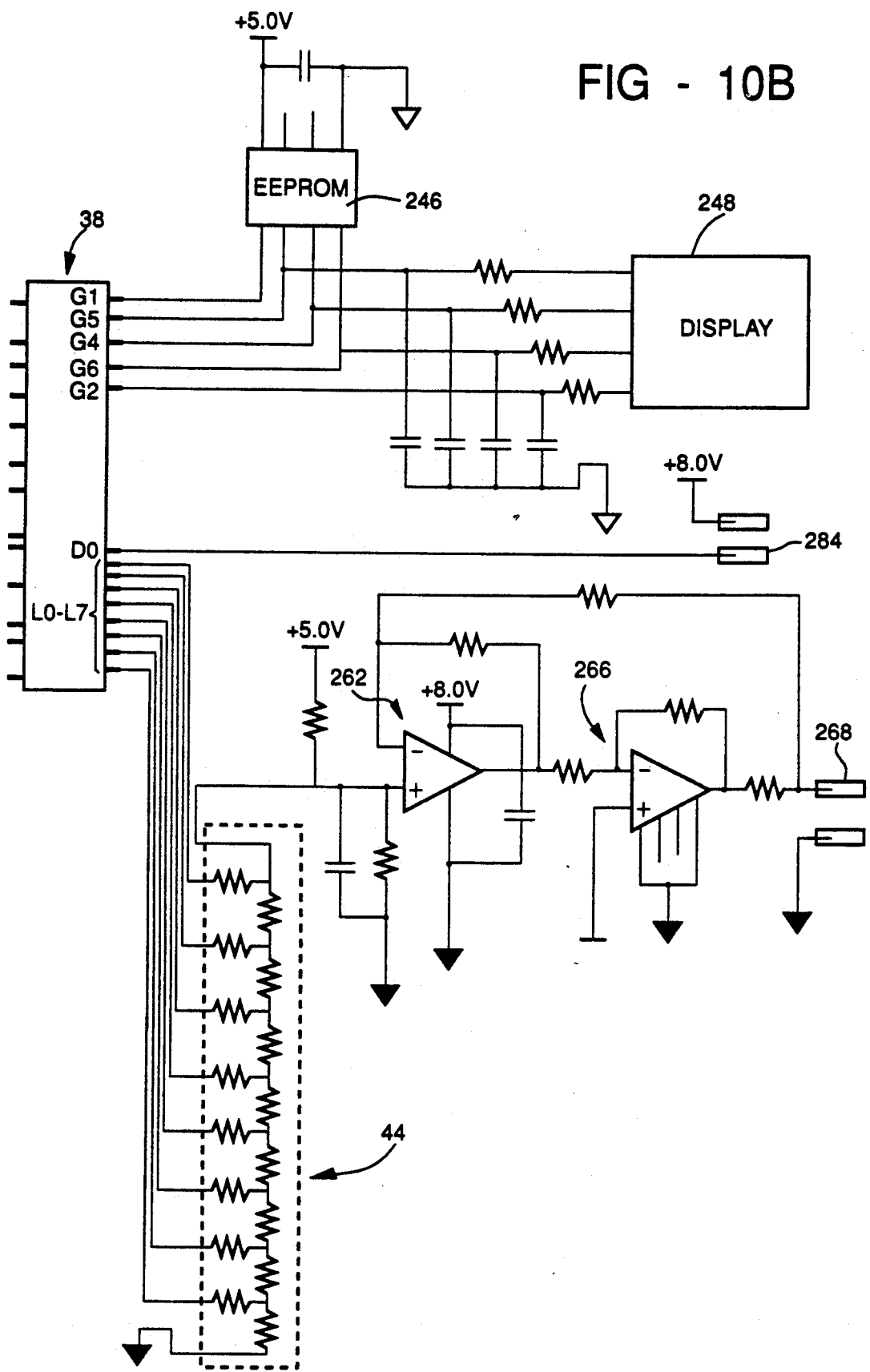

FIGS. 10A and 10B taken together form a schematic diagram of the electronic circuits, including the microcomputer 38, which are coupled with the circuits of FIGS. 8 and 9 described above and the circuit of FIG. 11 which will be described below. The microcomputer 38 is, in the illustrative example, an eight bit microprocessor type COP881C available from National Semi-Conductor, Inc. of Palo Alto, Calif. As shown in FIG. 10A, the microcomputer 38 is provided with a reset circuit 242 of conventional design coupled with the pins $V_{cc}$, Reset and Ground as indicated. The microcomputer is also provided with a clock circuit 244, also of conventional design, and connected with the pins CK1 and CK0. As shown in FIG. 10B, the microcomputer 38 is coupled with an EEPROM 246 at pins G1, G5, G4, and G6. The EEPROM 246 serves as a permanent memory for data to be stored when the power to the electronic circuit is interrupted. A compass heading display 248, such as a vacuum fluorescent display, is coupled to pins G5, G4 and G6. Referring again to FIG. 10A, a manual switching circuit 252 is coupled with microcomputer pins 10, 11, 12 and 13. A manual switch 254 is provided for use in connection with compensating the compass for variation. Also, a manual switch 255 is shown for changing the brightness of the display 248 but automatic means could be provided. The remaining circuits associated with the microcomputer 38, which will be described presently, are operative to control the sensors 10 and 10' and to process the output signals thereof to provide deviation compensation and to develop the heading direction signals. The heading is presented in alphanumeric form on the display 248 to indicate the cardinal and intercardinal compass points heading to the vehicle driver.

Figure 11:
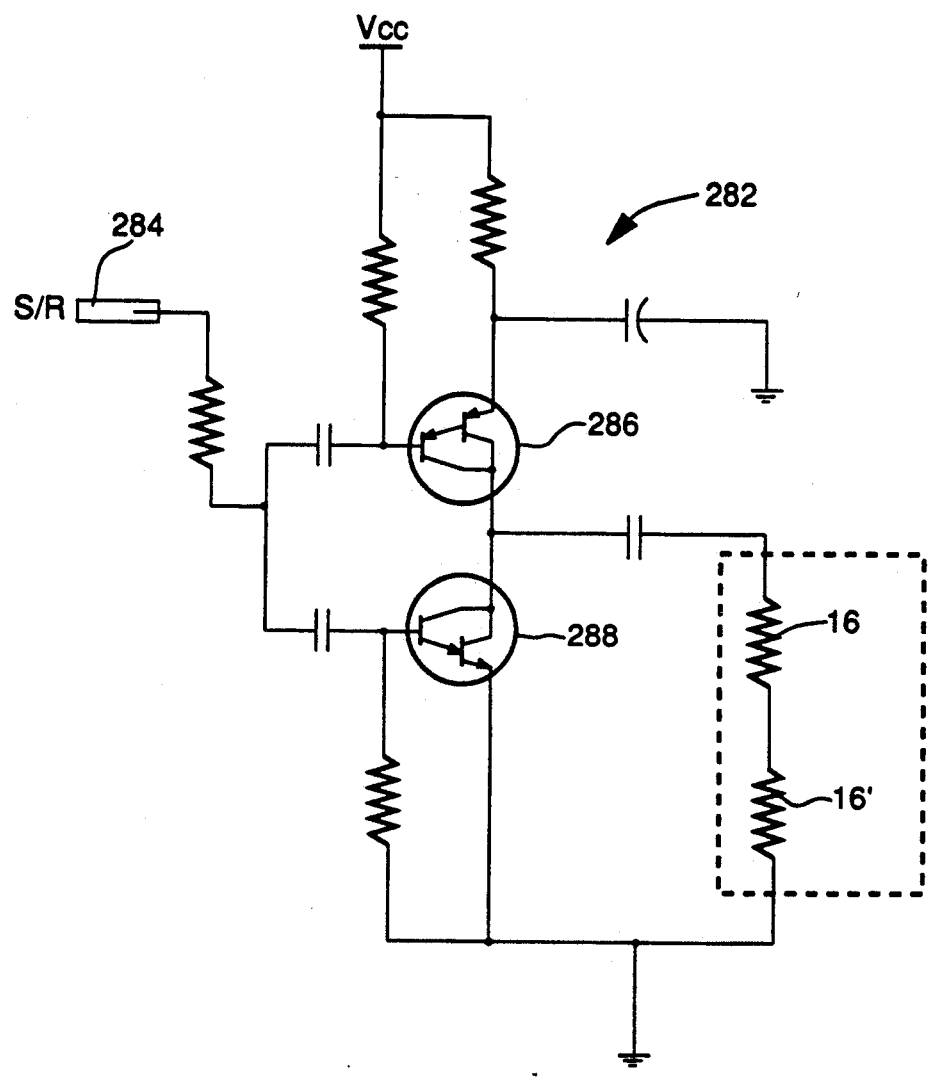
FIG. 11 is a schematic diagram of the bias current circuit for set and reset of the sensor.

A driver circuit 282 for the set/reset current straps 16 and 16' of the sensors 10 and 10' is shown in FIG. 11 The switching signal for the driver circuit 282 is produced by the microcomputer 38 at output pin D0 and applied to the input terminal 284. The driver circuit 282 comprises a pair of Darlington transistors 286 and 288 which are alternately switched conductive and nonconductive in response to the switching signal on connector 284. Accordingly, the current straps 16 and 16' are energized with current pulses as shown in the timing diagram of FIG. 6 and described above to provide the set and reset modes for the sensors 10 and 10' for the measurement of the Y-axis sensor output signal and X-axis sensor output signal, respectively.

As shown in FIG. 10A, the multiplexer 52 receives the Y-axis sensor output signal at terminal 214 and receives the X-axis sensor output signal at terminal 234. The multiplexer 52 is provided with an address signal from the data output pins D1 and D2 of the microcomputer 38 which is applied to pins A and B of the multiplexer 52. Thus, output signals of the Y-axis and X-axis sensors 10 and 10' are accessed alternately in timed relation with the set and reset modes as described with reference to FIG. 6. The sensor output signals are alternately outputted through pin 0/1 of the multiplexer to the A/D converter 42 shown in FIG. 10A. The A/D converter includes a comparator 256 which has its inverting input connected with the 0/1 output pin of the multiplexer 52. The non-inverting input of the comparator 256 is connected with the output of a ramp generator 258 which receives a pulsed input from pin D3 of the microcomputer 34. A clamp circuit 262 is coupled with the ramp generator 258 and clamps the ramp generator output at a certain voltage level so that the output does not go all the way to ground after each ramp which would require a time delay on build-up to the ramp reference voltage. The comparator 256 is operated with a reference voltage, for example, of about 2.5 volts on the non-inverting input. The A/D converter has a full scale range of 2.0 volts above the reference and, for example, the clamp voltage is about 2.3 volts. The ramp voltage is incremented at the rate of one millivolt per microsecond and the pulse count required to reach the signal voltage level at comparator 256 is stored in a register and represents the measured value of the sensor voltage applied to the A/D converter at comparator 256. The pulse count register indicates when the signal measurement is greater than the full scale range of the A/D converter 42.

As shown in FIG. 10B, the D/A converter 44 is coupled with output pins L0 through L7. The D/A converter 44 is a ladder network known as an R2R network and, for example, develops an output voltage of 2.5 volts at a register count of 127. The output of the D/A converter is applied through a voltage-to-current converter comprising amplifiers 262 and 266. The current amplifier 266 develops the offset current supply at connector 268 for the offset current straps 18 and 18' which are shown in FIG. 10A. The offset current return circuit 272 of FIG. 10A comprises an amplifier 274 which has its non-inverting input coupled with pin 2 of the multiplexer 52. The output of the amplifier 274 provides the offset current return at the terminal 276. The operation of the A/D converter 42 and the D/A converter 44 for developing the offset current required to provide deviation compensation is described above with reference to FIGS. 5A and 5B.

Although the description of this invention has been given with reference to a particular embodiment, it is not to be construed in a limiting sense. Many variations and modifications will now occur to those skilled in the art. For a definition of the invention, reference is made to the appended claims.

What is claimed is:

1. An electronic compass for use in a vehicle comprising:

a magnetoresistive sensor for detecting an external magnetic field and developing electronic signals representative of said external magnetic field, said external magnetic field being a combination of the earth magnetic field and a deviating field of the vehicle, a digital electronic circuit for determining the strength and direction of the vehicle deviating magnetic field, said sensor including means for nullifying said deviating magnetic field in said sensor, said nullifying means being coupled with said electronic circuit and energized thereby in accordance with the strength and direction of said deviating magnetic field whereby said sensor develops a deviation compensated signal corresponding to the earth field.

2. The invention as defined in claim 1 wherein:

said digital electronic circuit includes measurement means for measuring said electronic signals and determining the difference between the measured value and the value corresponding to the earth magnetic field, said electronic circuit including means for energizing said nullifying means in accordance with said difference.

3. The invention as defined in claim 1 wherein:

said electronic circuit and said nullifying means are operative while said vehicle is driven at different headings relative to the earth magnetic field for developing said deviation compensated signal corresponding to the earth field.

4. A method for compensating for the effect of a deviating magnetic field in a vehicle compass, said compass comprising:

a magnetic field sensing means which produces an output signal representative of an external magnetic field impinging on said sensing means, said external magnetic field having a component due to the earth magnetic field and a component due to a deviating magnetic field, said method comprising the steps of:

determining whether the actual value of the signal is different from a reference value which is approximately equal to that which would be produced by the earth magnetic field, if it is, generating an increment of compensating magnetic field impinging on said sensor in opposition to the deviating magnetic field, and repeating, alternately, the step of determining whether the actual value is different from the reference value and the step of generating an increment of compensating magnetic field until the actual value is substantially equal to the reference value.

5. An electronic compass for use in a vehicle, said compass comprising:

a first magnetoresistive sensor and a second magnetoresistive sensor for detecting an external magnetic field and developing electronic signals representative of the strength and direction of said external magnetic field, said external magnetic field being a combination of the earth magnetic field and a deviating magnetic field of the vehicle, each of said first and second sensors comprising at least one magnetoresistive field sensing element having a magnetic field sensitive axis and connected in an electrical network, said network having an output which provides an output signal representative of a component of said external magnetic field along said sensitive axis, said first and second sensors being oriented with their sensitive axes in a predetermined angular relation with each other, and a digital electronic circuit coupled with said output of said first sensor and said output of said second sensor and responsive to said electronic signals for producing compensated electronic signals representative of the magnetic heading of the vehicle.

6. An electronic compass for use in a vehicle, said compass comprising:

a first magnetoresistive sensor and a second magnetoresistive sensor for detecting an external magnetic field and developing electronic signals representative of the strength and direction of said external magnetic field, said external magnetic field and a deviating magnetic field of the vehicle, each of said first and second sensors comprising at least one magnetoresistive field sensing element having a magnetic field sensitive axis and connected in an electrical network, said network having an output which provides an output signal representative of a component of said external magnetic field along said sensitive axis, said first and second sensors being oriented with their sensitive axes in a predetermined angular relation with each other, and a digital electronic circuit coupled with said output of said first sensor and said output of said second sensor and responsive to said electronic signals for modifying said electronic signals in accordance with the value of said deviating magnetic field whereby modified electronic signals are produced which are representative of the magnetic heading of said vehicle.

7. An electronic compass for use in a vehicle, said compass comprising:

a magnetoresistive sensor for detecting an external magnetic field and developing electronic signals representative of the strength and direction of said external magnetic field, said external magnetic field being a combination of the earth magnetic field and a deviating magnetic field of the vehicle, a digital electronic circuit coupled with said sensor and responsive to said electronic signals, and electromagnetic means coupled with said sensor and with said electronic circuit for producing modified electronic signals which are compensated for said deviating magnetic field and representative of the magnetic heading of said vehicle.

8. In a magnetoresistive sensor for determining orientation with respect to an external magnetic field, said sensor being of the type comprising magnetoresistive sensing means having a sensitive axis for producing an output signal representative of an external magnetic field, and means for applying a bias magnetic field to said sensing means, the improvement comprising:

a magnetic field generating means for applying an offset magnetic field to said sensing means in a direction aligned with the sensitive axis of said sensing means.

9. The invention as defined in claim 8 wherein said field generating means comprises a current strap integral with and overlying said sensing means.

10. A compass for a vehicle comprising:

a first sensor and a second sensor, each of said sensors comprising magnetic field sensing means having a sensitive axis and having an output providing an output signal representative of an external magnetic field and having an offset field generating means for applying an offset magnetic field in a direction aligned with the sensitive axis of said sensing means, said first and second sensors being oriented with their sensitive axes in a predetermined angular relation with each other, and being aligned in a predetermined angular relation with respective axes of said vehicle, and said offset field generating means of said first sensor being coupled with said offset field generating means of said second sensor for energization from a second common source of energization.

11. The invention as defined in claim 10 including:

a multiplexer having a first input coupled with the output of said first sensor and a second input coupled with the output of said second sensor, an analog-to-digital converter having an input coupled with the output of said multiplexer, and a digital electronic circuit having an input coupled with the output of said analog-to-digital converter for processing said electrical signals produced by said first and second sensors to obtain direction information of said vehicle.

12. The invention as defined in claim 11 including:

a digital-to-analog converter having an input coupled with an output of said digital electronic circuit and having an output coupled with said offset field generating means of both the first and second sensors.

13. The invention as defined in claim 11 wherein:

said first and second inputs of said multiplexer are coupled by first and second capacitors, respectively, to the outputs of said first and second sensors, respectively, whereby the DC component of each of said output signals is suppressed.

14. The invention as defined in claim 10 wherein said offset field generating means are coupled to each other in a series circuit.

15. A compass for a vehicle comprising:

a first sensor and a second sensor, said sensors being oriented with their sensitive axes in a predetermined angular relation with each other and being aligned in a predetermined angular relation with respective axes of said vehicle, a multiplexer having a first input coupled with the output of said first sensor and having a second input coupled with the output of said second sensor, a circuit having a dc reference voltage output, an analog-to-digital converter having an input coupled with the output of said multiplexer, and including means for determining the magnitude of the output signal of said first sensor and the output signal of said second sensor relative to said reference voltage, and a digital electronic circuit having an input coupled with the output of said analog-to-digital converter for obtaining direction information of said vehicle.

16. The invention as defined in claim 15 wherein said analog-to-digital converter includes:

a comparator having one input coupled with the output of said multiplexer and the other input connected with a ramp voltage.

17. The invention as defined in claim 15 wherein said analog-to-digital converter includes:
a ramp generator having one input coupled with a ramp control pulse output of said digital electronic circuit,
and a clamping circuit coupled with said ramp generator for clamping the output thereof at a predetermined voltage level, said ramp generator output being coupled with said other input of said comparator.

18. The invention as defined in claim 15 wherein:
said multiplexer has a third input coupled with said DC reference voltage output,
means for eliminating the DC component of said output signals of said first and second sensors to obtain an AC output signal corresponding to said first and second sensors,
means for adding said DC reference voltage to each of said AC output signals to obtain a modified output signal corresponding to each of said first and second sensors,
means for operating said multiplexer for alternately applying said modified signals and said reference voltage alternately to the input of said analog-to-digital converter whereby the magnitude of each of said AC output signals is determined relative to said reference voltage.

19. A compass for a vehicle comprising:
first and second sensors, each of said sensors comprising magnetoresistive magnetic field sensing means having a sensitive axis and having an output providing an output signal representative of an external magnetic field, an electrical conductor means for applying a bias magnetic field to said sensing means, and an electromagnetic offset field generating means for applying with the sensitive axis of said sensing means,
said sensors being oriented with their sensitive axes in a predetermined angular relation with each other and being aligned in a predetermined angular relation with respective axes of said vehicle,
a multiplexer having a first input coupled with the output of said first sensor and a second input coupled with the output of said second sensor,
an analog-to-digital converter having an input coupled with the output of said multiplexer for measuring the output signals of each of said sensors, said analog-to-digital converter having a full scale measurement substantially equal to the value of said output signals corresponding to the maximum earth field to be sensed by said sensors,
and a digital electronic circuit having an input coupled with the output of said analog-to-digital converter for processing said electrical signals produced by said first and second sensors to obtain direction information of said vehicle,
said electronic circuit being operative to incrementally change the value of current in said offset field generating means when the output signal of said first sensor differs from said full scale measurement and when the output signal of said second sensor differs from said full scale measurement.

20. The invention as defined in claim 19 wherein:
said electronic circuit is operative to adjust the current in said offset field generating means continuously during vehicle operation.

21. The invention as defined in claim 19 wherein:
said electronic circuit includes means for applying an alternate polarity periodic bias current to said electrical conductor means for switching said sensing means between a set and a reset state.

22. The invention as defined in claim 21 wherein said electronic circuit means includes:
means for measuring said output signal of said X-axis sensor during both the set state and the reset state thereof and for measuring said output signal of said Y-axis sensor during the set state and the reset state thereof.

23. The invention defined by claim 19 wherein:
said first and second inputs of said multiplexer are coupled by first and second capacitors, respectively, to said outputs of said first and second sensors, respectively, whereby the DC component of each of said output signals is suppressed.

24. A compass for a vehicle comprising:
first and second sensors, each of said sensors comprising magnetoresistive magnetic field sensing means having a sensitive axis and having an output providing an output signal representative of an external magnetic field,
means for applying an alternate-polarity bias magnetic field to each of said sensing means whereby the output signal of each sensor has an AC and a DC component,
said sensors being oriented with their sensitive axes in a known angular relationship with each other and being oriented in a predetermined angular relationship with the axes of said vehicle,
and a digital electronic circuit for processing said electrical signals produced by said sensors to obtain direction information of said vehicle,
said output of each of said sensors being coupled with said digital electronic circuit by a capacitor whereby the DC component of each of said output signals is suppressed.

25. The invention as defined in claim 24 including:
a circuit having a DC reference voltage output,
a multiplexer having an output and having first, second and third inputs coupled respectively with the output of said first sensor, the output of said second sensor and said reference voltage output,
means for adding said DC reference voltage to each of said output signals after said DC component is suppressed to obtain modified output signals corresponding to each of said first and second sensors,
means for operating said multiplexer for alternately applying said modified signals and said reference voltage alternately to the input of said analog-to-digital converter whereby the magnitude of each of said AC output signals is determined relative to said reference voltage.

* * * * *

UNITED STATES PATENT AND TRADEMARK OFFICE
CERTIFICATE OF CORRECTION

PATENT NO. : 5,255,442

DATED : October 26, 1993

INVENTOR(S) : Schierbeek et al.

It is certified that error appears in the above-identified patent and that said Letters Patent is hereby corrected as shown below:

Column 5, lines 29, 32, 33, 35, 36, 39, 46, 50, 55, 59 through Column 6, lines 4, and 10, in each instance delete "$M_c$" and substitute -- $M_c$ --.

Column 5, lines 34, 37, and 43, in each instance delete "$V_c$" and substitute -- $V_c$ --.

Column 6, line 62, delete "With" and substitute -- with --.

Column 6, lines 65, 66 to Column 7, lines 1, 7, 13, 16, and 47, in each instance delete "$V_{cy}$" and substitute -- $V_{cy}$ --.

Column 7, line 13, delete "$V_{cymax}$" and substitute -- $V_{cymax}$ --.

Column 7, line 15, delete "$V_{cymin}$" and substitute -- $V_{cymin}$".

Column 7, line 43, delete "$E_{yin}$" and substitute -- $E_y$ in --.

Column 10, line 62, after "11" insert -- . -- .

UNITED STATES PATENT AND TRADEMARK OFFICE
CERTIFICATE OF CORRECTION

PATENT NO. : 5,255,442
DATED : October 26, 1993
INVENTOR(S) : Schierbeek et al.

It is certified that error appears in the above-identified patent and that said Letters Patent is hereby corrected as shown below:

Column 13, line 18, before "and " insert -- being a combination of the earth magnetic field --.

Column 15, line 39 after "applying" insert -- an offset magnetic field in a direction aligned --.

Signed and Sealed this

Eighth Day of November, 1994

Attest:

BRUCE LEHMAN

Attesting Officer     Commissioner of Patents and Trademarks